United States Patent (10) Patent No.: US 8,102,717 B2
Cha et al. (45) Date of Patent: Jan. 24, 2012

(54) METHOD OF TESTING FOR A LEAKAGE CURRENT BETWEEN BIT LINES OF NONVOLATILE MEMORY DEVICE

(75) Inventors: Jae Won Cha, Gyeonggi-do (KR); Duck Ju Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 102 days.

(21) Appl. No.: 12/649,666

(22) Filed: Dec. 30, 2009

(65) Prior Publication Data

US 2010/0302866 A1 Dec. 2, 2010

(30) Foreign Application Priority Data

May 29, 2009 (KR) ........................ 10-2009-0047818

(51) Int. Cl.
*G11C 16/04* (2006.01)

(52) U.S. Cl. .......... 365/185.25; 365/185.18; 365/185.09

(58) Field of Classification Search ............. 365/185.25, 365/185.18, 185.09
See application file for complete search history.

(56) References Cited

U.S. PATENT DOCUMENTS

2002/0089879 A1* 7/2002 Kobayashi et al. ...... 365/189.01
2008/0170445 A1* 7/2008 Mori ........................ 365/189.07

FOREIGN PATENT DOCUMENTS

KR 1020090026496 3/2009

* cited by examiner

*Primary Examiner* — Huan Hoang
(74) *Attorney, Agent, or Firm* — IP & T Group LLP

(57) ABSTRACT

A method of testing for a leakage current between bit lines of a nonvolatile memory device includes providing the nonvolatile memory device with a page buffer having first and second bit lines coupled thereto, precharging the first bit line to a first voltage, supplying a second voltage to the second bit line, floating the second bit line and evaluating the second bit line for a set time period, and detecting a voltage level of the second bit line and outputting a test result of testing for the leakage current between the first and second bit lines by the page buffer.

10 Claims, 4 Drawing Sheets

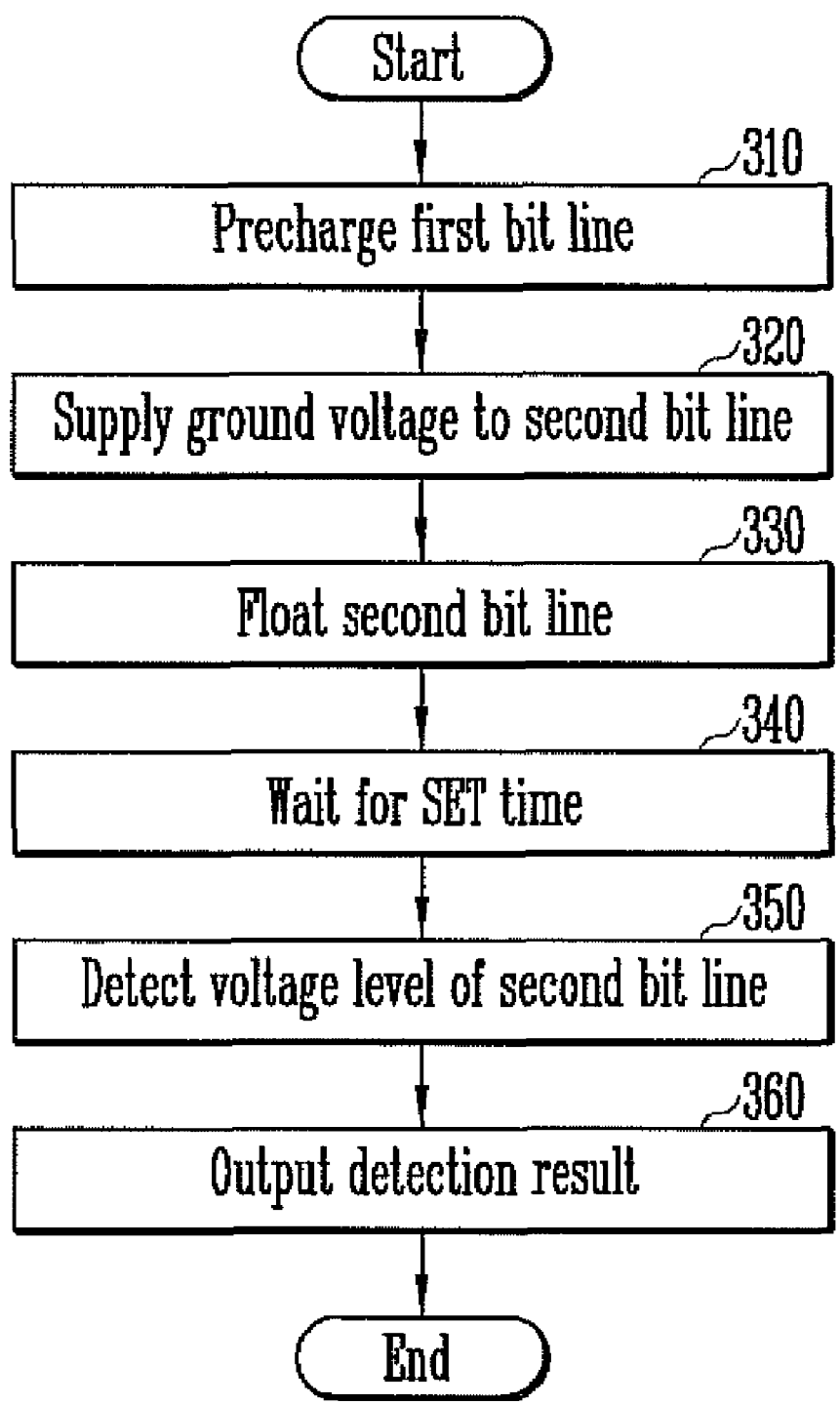

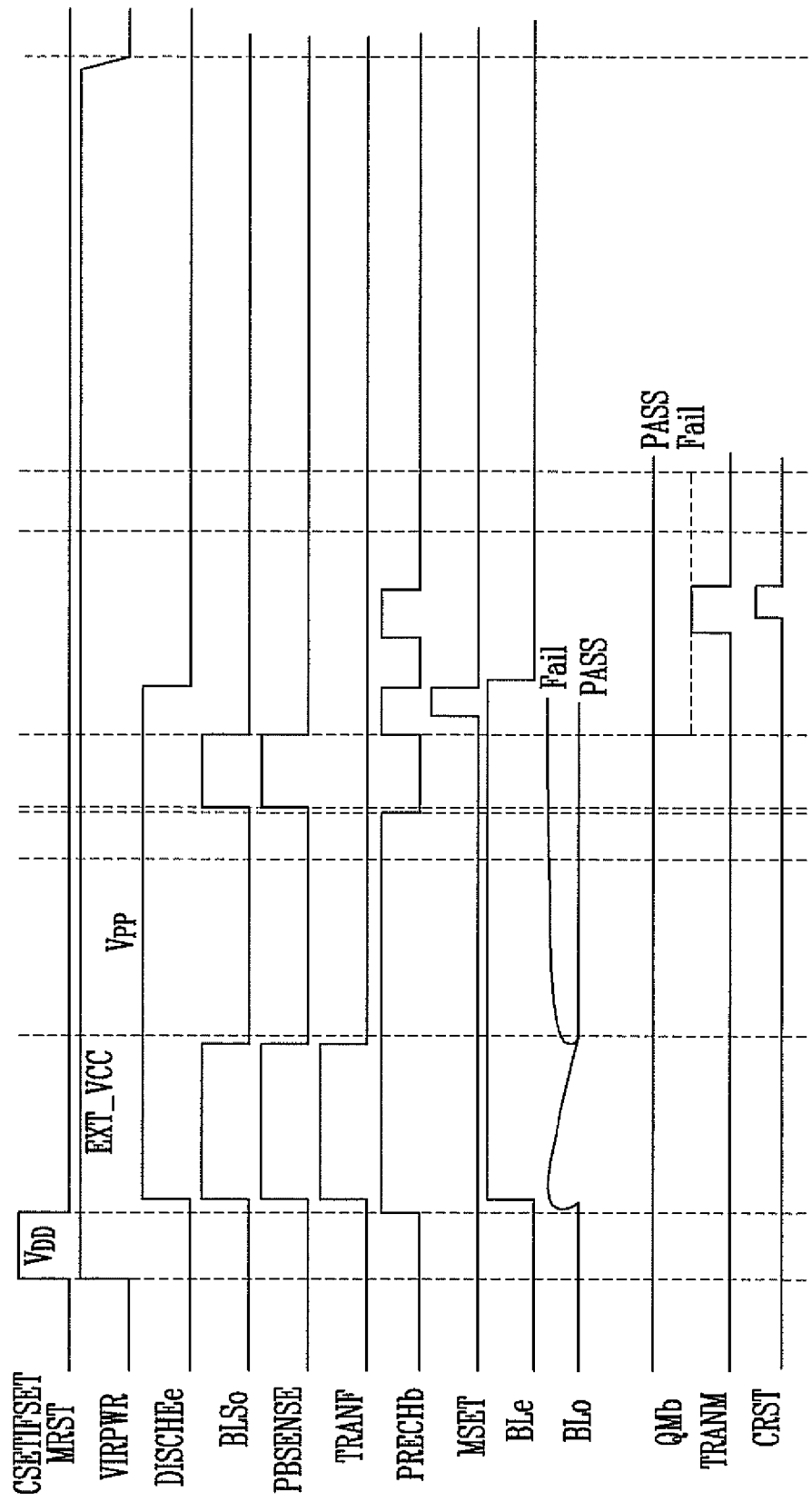

METHOD OF TESTING FOR A LEAKAGE CURRENT BETWEEN BIT LINES OF NONVOLATILE MEMORY DEVICE

CROSS-REFERENCE TO RELATED APPLICATIONS

Priority to Korean patent application number 10-2009-0047818 filed on May 29, 2009, the entire disclosure of which is incorporated by reference herein, is claimed.

BACKGROUND OF THE INVENTION

Embodiments of the present invention relate to a method of testing for a leakage current between bit lines of a nonvolatile memory device and, more particularly, to a method of testing for a leakage current between the bit lines of a nonvolatile memory device, the method having an improved accuracy.

The memory cell array of a NAND flash memory device of nonvolatile memory devices includes a number of strings in each of which a number of memory cells are coupled in series to one bit line. In the flash memory device constructed as above, the spacing between the bit lines is made relatively narrow in order to reduce the chip size. This brings neighboring bit lines in contact with each other because of processing failures. Consequently, a leakage current can occur between bit lines because of a bridge phenomenon.

FIG. 1 is a circuit diagram of a conventional nonvolatile memory device. A conventional method of testing for a leakage current between bit lines is described below with reference to FIG. 1.

First, a discharge signal DISCHe is supplied to a bit line selection unit 10, and so a test voltage VIRPWR of about 1 V is supplied to the even bit line BLe of a memory cell array. A discharge signal DISCHo of a low level is supplied and the even bit line BLo of the memory cell array is maintained in a floating state.

When the discharge signal DISCHe shifts to a low level, a bridge may occur between the even bit line BLe and the odd bit line BLo. Accordingly, the voltage level of the even bit line BLe drops from a precharged voltage level if the bridge occurs or maintains an initial precharge level if the bridge fails to occur.

A page buffer 20 detects a shift in the voltage level of the even bit line BLe and outputs a pass or fail signal of the test operation based on a result of the detection.

In the conventional method of testing for a leakage current between the bit lines of the nonvolatile memory device, an evaluation time period is desired not to be long because the leakage current and an off-cell leakage current are generated through a junction. Further, it is difficult to detect the leakage current between the bit lines because a difference in the voltage level between the even bit line BLe and the odd bit line BLo is small and therefore, the leakage current is small.

SUMMARY OF THE INVENTION

Embodiments of the present invention relate to a method of testing for a leakage current between the bit lines of a nonvolatile memory device, the method having an improved sense margin during a test operation and having improved test operation accuracy by precharging a first bit line to a high voltage, floating a second bit line neighboring the first bit line for a set time period, and then detecting a voltage level of the second bit line by a page buffer.

A method of testing for a leakage current between the bit lines of a nonvolatile memory device according to an embodiment of the present invention includes precharging a first bit line of the nonvolatile memory device having a page buffer having the first bit line and second bit line coupled thereto to a first voltage, floating the second bit line and evaluating the second bit line for a set time period, and detecting a voltage level of the second bit line and outputting a test result of testing for the leakage current between the first and second bit lines by the page buffer.

Precharging the first bit line to a first voltage includes supplying a test voltage to the first bit line by the bit line selection unit of the page buffer. The test voltage is an external power supply voltage.

Supplying a second voltage to the second bit line includes supplying a ground voltage to the second bit line to prevent the voltage level of the second bit line from rising due to capacitance coupling while precharging the first bit line.

Supplying a second voltage to the second bit line includes supplying a ground voltage by the sense node and the latch of the page buffer.

After the second bit line is floated, if a bridge phenomenon occurs between the first and second bit lines, the voltage level of the second bit line rises, and if the bridge phenomenon fails to occur, the voltage level of the second bit line remains unchanged.

Detecting a voltage level of the second bit line and outputting a test result of testing for the leakage current between the first and second bit lines by the page buffer includes detecting the voltage level of the second bit line and storing detection data in a latch of the page buffer, and outputting the detection data as the test result of testing for the leakage current between the first and second bit lines.

BRIEF DESCRIPTION OF THE DRAWINGS

FIG. 3 is a flowchart illustrating the method of testing for a leakage current between the bit lines of the nonvolatile memory device according to an embodiment of the present invention; and FIG. 4 is a waveform diagram showing a signal waveform of the page buffer illustrating the method of testing for a leakage current between the bit lines of the nonvolatile memory device according to an embodiment of the present invention.

DESCRIPTION OF THE INVENTION

Figure 1:
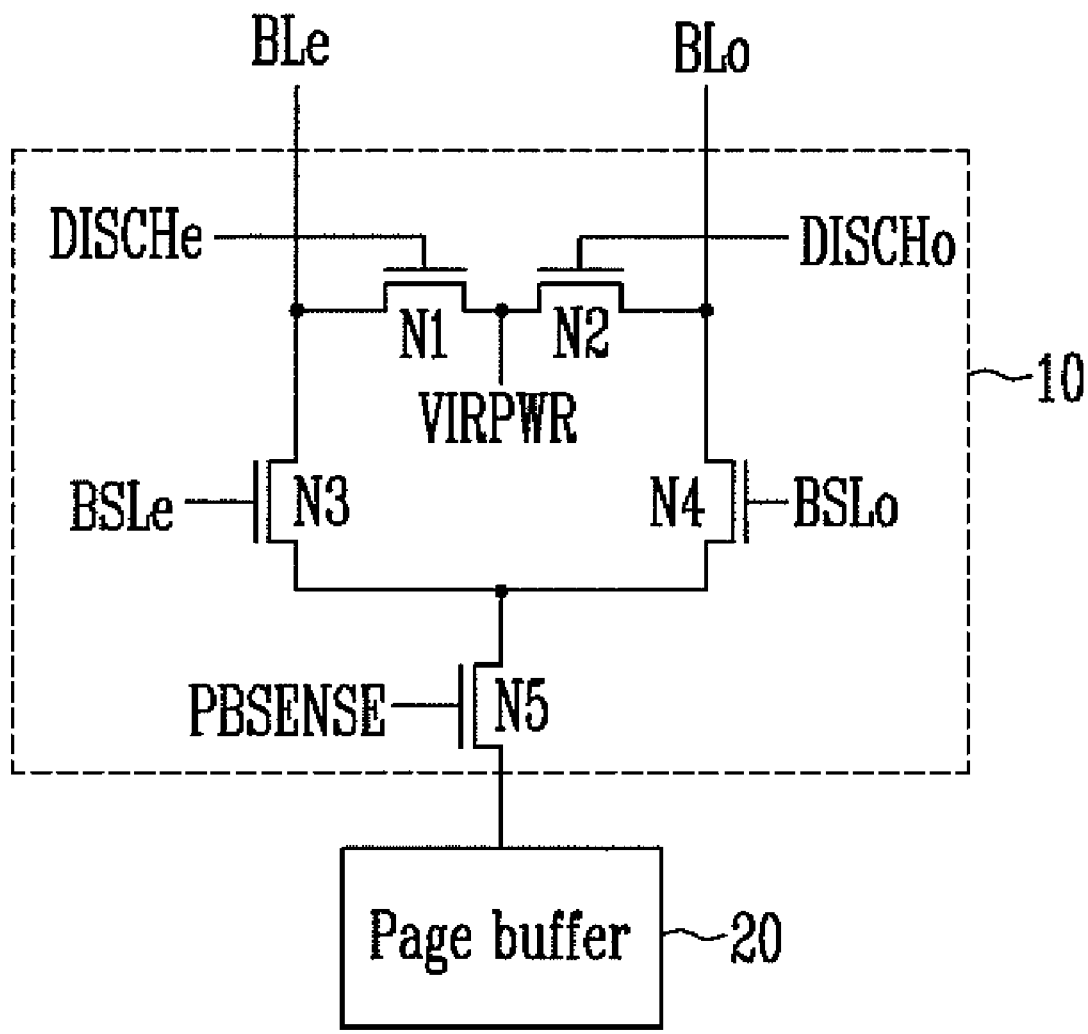
FIG. 1 is a circuit diagram of a conventional nonvolatile memory device.

Hereinafter, embodiments of the present invention are described in detail with reference to the accompanying drawings. The drawing figures are provided to allow those having ordinary skill in the art to understand the scope of the embodiments of the present invention.

Figure 2:
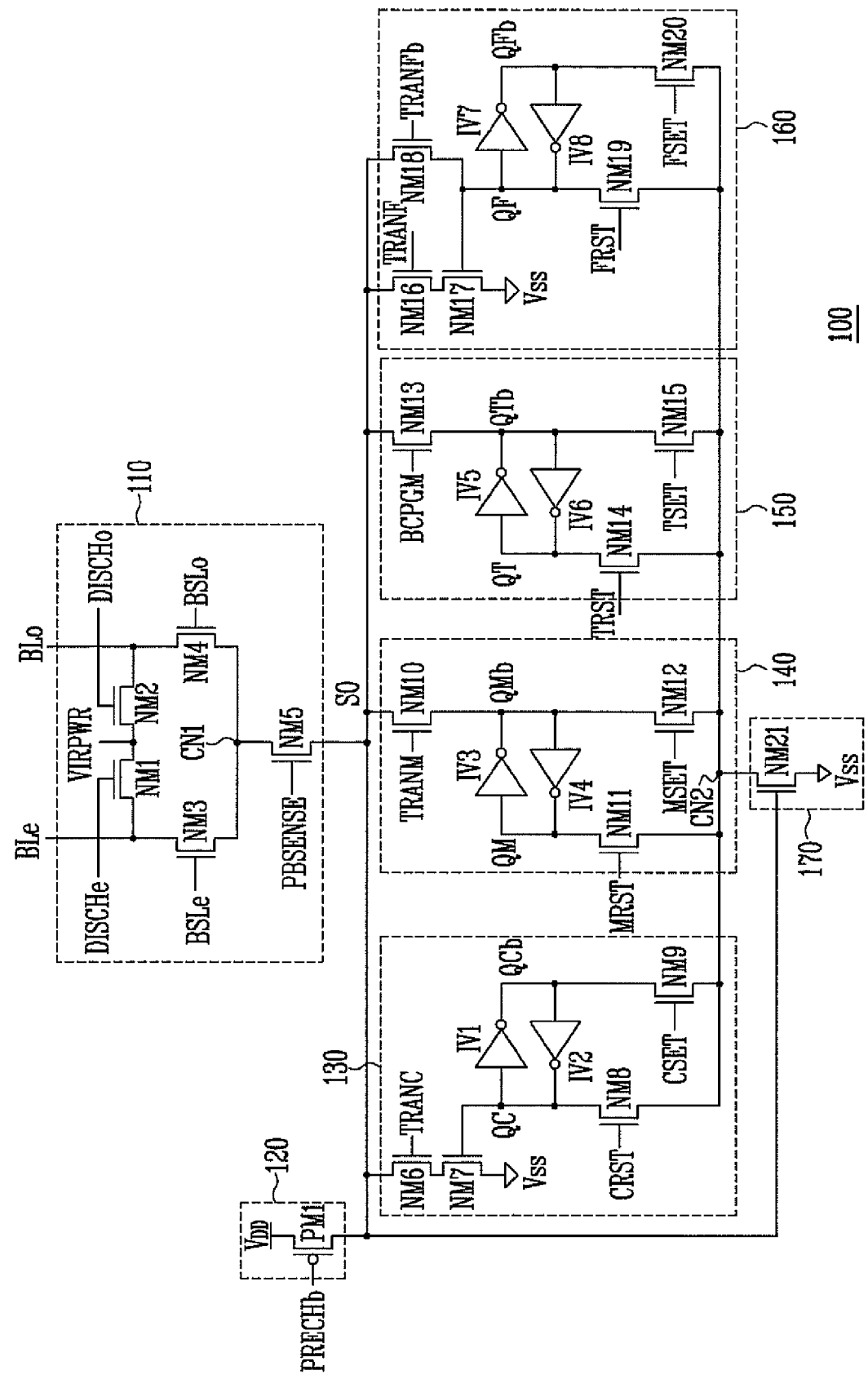
FIG. 2 is a circuit diagram of a page buffer for illustrating a method of testing for a leakage current between the bit lines of a nonvolatile memory device according to an embodiment of the present invention.

FIG. 2 is a circuit diagram of a page buffer for illustrating a method of testing for a leakage current between the bit lines of a nonvolatile memory device according to an embodiment of the present invention.

Referring to FIG. 2, the page buffer 100 includes a bit line selection unit 110, a precharge unit 120, a cache latch 130, a main latch 140, a temporary latch 150, a flag latch 160, and a sense unit 170.

The bit line selection unit 110 includes a number of NMOS transistors NM1 to NM5. The NMOS transistor NM1 and the NMOS transistor NM2 are coupled in series between an even bit line BLe and an odd bit line BLo, coupled to a memory cell array, and are configured to supply a test voltage VIRPWR to the respective bit lines BLe and BLo in response to respective discharge signals DISCHe and DISCHo. The NMOS transistors NM3 and NM4 are coupled between the bit lines BLe and BLo and a first common node CN1 and are configured to couple the first common node CN1 and the respective bit lines BLe or BLo together in response to respective bit line selection signals BSLe and BSLo. The NMOS transistor NM5 is coupled between the first common node CN1 and a sense node SO and is configured to couple the first common node CN1 and the sense node SO together in response to a sense signal PBSENSE.

The precharge unit 120 includes a PMOS transistor PM1 coupled between a power supply voltage terminal $V_{DD}$ and the sense node SO. The PMOS transistor PM1 is configured to supply the power supply voltage $V_{DD}$ to the sense node SO or to block the power supply voltage $V_{DD}$ to the sense node SO in response to a precharge signal PRECHb.

The cache latch 130 includes a number of NMOS transistors NM6 to NM9 and inverters IV1 and IV2.

The inverters IV1 and IV2 are coupled in parallel between a first node QC and a second node QCb in a cross-coupled manner, thus forming a latch structure. The NMOS transistor NM6 and the NMOS transistor NM7 are coupled in series between the sense node SO and a ground voltage Vss. The NMOS transistor NM6 is turned on in response to a transfer signal TRANC. The NMOS transistor NM7 is turned on in response to a voltage level of the first node QC, thus changing a voltage level of the sense node SO in response to a value of data stored in the latch. The NMOS transistor NM8 and the NMOS transistor NM9 are coupled between a second common node CN2, and the first node QC and the second node QCb. The NMOS transistor NM8 is configured to couple the first node QC and the second common node CN2 together in response to a first cache control signal CRST, and the NMOS transistor NM9 is configured to couple the second node QCb and the second common node CN2 together in response to a second cache control signal CSET.

The main latch 140 includes a number of NMOS transistors NM10 to NM12 and inverters IV3 and IV4.

The inverters IV3 and IV4 are coupled in parallel between a third node QM and a fourth node QMb in a cross-coupled manner, thus forming a latch structure. The NMOS transistor NM10 is coupled between the sense node SO and the fourth node QMb and is turned on in response to a transfer signal TRANM, thus changing a voltage level of the sense node SO in response to a value of data stored in the latch. The NMOS transistor NM11 and the NMOS transistor NM12 are coupled between the second common node CN2, and the third node QM and the fourth node QMb. The NMOS transistor NM11 is configured to couple the third node QM and the second common node CN2 together in response to a first main control signal MRST, and the NMOS transistor NM12 is configured to couple the fourth node QMb and the second common node CN2 together in response to a second main control signal MSET.

The temporary latch 150 includes a number of NMOS transistors NM13 to NM15 and inverters IV5 and IV6.

The inverters IV5 and IV6 are coupled in parallel between a fifth node QT and a sixth node QTb in a cross-coupled manner, thus forming a latch structure. The NMOS transistor NM13 is coupled between the sense node SO and the sixth node QTb and is turned on in response to a program signal BCPGM, thus changing a voltage level of the sense node SO in response to a value of data stored in the latch. The NMOS transistor NM14 and the NMOS transistor NM15 are coupled between the second common node CN2, and the fifth node QT and the sixth node QTb. The NMOS transistor NM14 is configured to couple the fifth node QT and the second common node CN2 together in response to a first temporary control signal TRST, and the NMOS transistor NM15 is configured to couple the sixth node QTb and the second common node CN2 together in response to a second temporary control signal TSET.

The flag latch 160 includes a number of NMOS transistors NM16 to NM20 and inverters IV7 and IV8.

The inverters IV7 and IV8 are coupled in parallel between a seventh node QF and an eighth node QFb in a cross-coupled manner, thus forming a latch structure. The NMOS transistor NM16 and the NMOS transistor NM17 are coupled in series between the sense node SO and the ground voltage Vss. The NMOS transistor NM16 is turned on in response to a transfer signal TRANF. The NMOS transistor NM17 is turned on in response to a voltage level of the seventh node QF, thus changing a voltage level of the sense node SO in response to a value of data stored in the latch. The NMOS transistor NM18 is coupled between the sense node SO and the seventh node QF and is turned on in response to a transfer signal TRANFb, thus changing a voltage level of the sense node SO in response to a value of data stored in the latch. The NMOS transistor NM19 and the NMOS transistor NM20 are coupled between the second common node CN2, and the seventh node QF and the eighth node QFb. The NMOS transistor NM19 is configured to couple the seventh node QF and the second common node CN2 in response to a first flag control signal FRST, and the NMOS transistor NM20 is configured to couple the eighth node QFb and the second common node CN2 in response to a second flag control signal FSET.

The sense unit 170 includes an NMOS transistor NM21. The NMOS transistor NM21 is coupled between the second common node CN2 and the ground voltage Vss. The NMOS transistor NM21 is turned on in response to a voltage level of the sense node SO, thus supplying the second common node CN2 with the ground voltage Vss.

FIG. 3 is a flowchart illustrating the method of testing for a leakage current between the bit lines of the nonvolatile memory device according to an embodiment of the present invention. FIG. 4 is a waveform diagram showing a signal waveform of the page buffer illustrating the method of testing for a leakage current between the bit lines of the nonvolatile memory device according to an embodiment of the present invention.

The method of testing for a leakage current between the bit lines of the nonvolatile memory device according to an embodiment of the present invention is described below with reference to FIGS. 2 to 4.

First, the cache latch 130, the main latch 140, the temporary latch 150, and the flag latch 160 of the page buffer 100 are respectively reset in response to the second cache control signal CSET, the first main control signal MRST, the second temporary control signal TSET, and the second flag control signal FSET.

The test voltage VIRPWR is then 'activated'. The test voltage VIRPWR is 'activated' to have a high voltage of about 4 V using an external power supply voltage EXT_VCC. The precharge signal PRECHb of a low level is then supplied to the precharge unit 120 to precharge the sense node SO.

The discharge signal DISCHe having a high voltage Vpp is then supplied to the bit line selection unit 110 to supply the test voltage VIRPWR to the even bit line BLe. Accordingly, the even bit line BLe is precharged to the high voltage of about 4 V (310 of FIG. 3).

When the even bit line BLe is precharged to the high voltage level, the voltage level of the odd bit line BLo neighboring the even bit line BLe can also rise because of a capacitance coupling phenomenon. To suppress such a phenomenon, the ground voltage Vss is supplied to the odd bit line BLo (320 of FIG. 3). In more detail, the precharge signal PRECHb shifts from a low level to a high level to block the power supply voltage $V_{DD}$ supplied to the sense node S. The bit line selection signal BLSo and the sense signal PBSENSE are supplied to the bit line selection unit 110, to couple the odd bit line BLo and the sense node SO together. The transfer signal TRANF is then supplied to the NMOS transistor NM16 of the flag latch 160. When the seventh node QF is reset to a high level and the NMOS transistor NM17 is turned on, then the NMOS transistor NM16 is turned on in response to the transfer signal TRANF, and the ground voltage Vss is supplied to the sense node SO. Accordingly, the ground voltage Vss is supplied to the odd bit line BLo coupled to the sense node SO, and the odd bit line BLo has a voltage level of 0 V. Consequently, although the even bit line BLe rises to a high voltage level, the odd bit line BLo is discharged to 0 V.

The bit line selection signal BLSo and the sense signal PBSENSE supplied to the bit line selection unit 110 are blocked to float the odd bit line BLo (330 of FIG. 3).

The odd bit line BLo then waits for a set time period (340 of FIG. 3) in order to secure an evaluation time period. If a bridge phenomenon bridge in which the even bit line BLe and the odd bit line BLo are electrically coupled together occurs, the voltage level of the odd bit line BLo rises in response to the voltage level of the even bit line BLe during the evaluation time period. Accordingly, if the bridge phenomenon occurs (i.e., fail), the voltage level of the odd bit line BLo rises. However, if the bridge phenomenon does not occur (i.e., pass), the voltage level of the odd bit line BLo is maintained at 0 V. The set time period is preferably set to 1 second. However, the set time period can be increased or decreased according to the embodiment of the present invention.

The voltage level of the odd bit line BLo is then detected (350 of FIG. 3). In more detail, the precharge signal PRECHb of a low level is supplied to the precharge unit 120 for a set time period, to precharge the sense node SO. After the precharge signal PRECHb shifts from a low level to a high level, the bit line selection signal BLSo and the sense signal PBSENSE are supplied to the bit line selection unit 110, to couple the odd bit line BLo and the sense node SO together. Accordingly, the voltage level of the sense node SO is maintained at a high level or discharged to a low level according to the voltage level of the odd bit line BLo. When the odd bit line BLo shifts to a high level because of the bridge phenomenon, the sense node SO IS maintained at a high level, and so the NMOS transistor NM21 of the sense unit 179 is turned on. When the second main control signal MSET is supplied to the main latch 140, the voltage levels of the third and fourth nodes QM and QMb of the main latch 140 are changed in response to the voltage level of the sense node SO. In other words, if the bridge phenomenon occurs, the third node QM shifts to a high level in response to the high voltage level of the sense node SO. That is, data corresponding to the leakage current generated by the bridge phenomenon are stored in the main latch 140.

The data stored in the main latch 140 are then transmitted to the cache latch 130 (360 of FIG. 3). In more detail, the precharge signal PRECHb of a low level is supplied to the precharge unit 120 for a set time period to precharge the sense node SO. The transfer signal TRANM is then supplied to the main latch 140 to either change or to maintain the voltage level of the sense node SO in response to a value of data stored in the latch. Data are stored in the cache latch 140 in response to the first cache control signal CRST being supplied to the cache latch 130. The data stored in the cache latch 140 are outputted as a result of the test on the leakage current resulting from a bridge phenomenon.

According to this embodiment of the present invention, test voltages of a high voltage 4 V and a ground voltage 0 V are supplied to the even and odd bit lines BLe and BLo in order to increase a difference in the voltage level as compared with conventional arrangements. Accordingly, a sense margin is increased, and the accuracy of a test for a bridge phenomenon is improved. Furthermore, a determination is made as to whether the voltage level of a bit line to which the ground voltage 0V has been supplied has risen without detecting the voltage level of a bit line to which a high voltage has been supplied. Accordingly, the accuracy of a test operation is enhanced because an evaluation time period is increased.

As described above, according to this embodiment of the present invention, a first bit line is precharged to a high voltage, and a second bit line neighboring the first bit line is floated for a set time period. A voltage level of the second bit line is then detected by the page buffer. Accordingly, the sense margin of a test operation is improved, resulting in improved accuracy of the test.

What is claimed is:

1. A method of testing for a leakage current between bit lines of a nonvolatile memory device, the method comprising:
   supplying a test voltage to a first bit line of the nonvolatile memory device having a page buffer having the first bit line and a second bit line coupled thereto to a first voltage;
   supplying a second voltage to the second bit line;
   floating the second bit line and evaluating the second bit line for a set period of time;
   measuring a voltage of the second bit line by the page buffer and latching a sensing result in the page buffer; and
   determining whether the leakage current has occurred between the first bit line and the second bit line by sensing the voltage of the second bit line by the page buffer and storing a first data in the page buffer when the leakage current has occurred between the first bit line and the second bit line and storing a second data in the page buffer when the leakage current has not occurred between the first bit line and the second bit line.

2. The method of claim 1, wherein supplying the test voltage to the first bit line to the first voltage comprises supplying the test voltage to the first bit line by a bit line selection unit of the page buffer, and wherein the test voltage comprises an external power supply voltage.

3. The method of claim 1, wherein supplying a second voltage to the second bit line comprises supplying a ground voltage to the second bit line to prevent the voltage level of the second bit line from rising due to capacitance coupling while precharging the first bit line.

4. The method of claim 1, wherein supplying a second voltage to the second bit line comprises supplying a ground voltage to a sense node and a latch of the page buffer.

5. The method of claim 1, wherein the voltage level of the second bit line rises in response to a bridge phenomenon occurring between the first and second bit lines after the second bit line is floated, and wherein the voltage level of the second bit line is unchanged in response to the bridge phenomenon failing to occur after the second bit line is floated.

6. A method of testing for a leakage current between bit lines of a nonvolatile memory device, the method comprising:
   precharging a first bit line to a test voltage;

supplying a ground voltage to a second bit line neighboring the first bit line after the first bit line has been precharged;

floating the second bit line and evaluating the second bit line for a set time period after the first bit line has been precharged; and measuring a voltage of the second bit line by the page buffer and latching a sensing result in the page buffer; and determining whether the leakage current has occurred between the first bit line and the second bit line by sensing the voltage of the second bit line by the page buffer and storing a first data in the page buffer when the leakage current has occurred between the first bit line and the second bit line and storing a second data in the page buffer when the leakage current has not occurred between the first bit line and the second bit line.

7. The method of claim 6, wherein supplying a ground voltage to a second bit line neighboring the first bit line comprises supplying the ground voltage to the second bit line to prevent the voltage level of the second bit line from rising due to capacitance coupling while precharging the first bit line.

8. The method of claim 6, wherein supplying a ground voltage to a second bit line neighboring the first bit line comprises coupling the second bit line to the ground voltage by a page buffer coupled to the second bit line.

9. The method of claim 6, wherein detecting a shift in a voltage level of the second bit line and testing for the leakage current between the first bit line and the second bit line comprises detecting the voltage level of the second bit line, temporarily storing detection data as test data, and outputting the test data by a page buffer coupled to the second bit line.

10. The method of claim 6, wherein the voltage level of the second bit line rises in response to a bridge phenomenon occurring between the first and second bit lines after the second bit line is floated, and wherein the voltage level of the second bit line is unchanged in response to the bridge phenomenon failing to occur after the second bit line is floated.

* * * * *